United States Patent
Li et al.

(10) Patent No.: US 11,377,229 B2
(45) Date of Patent: Jul. 5, 2022

(54) INTERNET CONNECTED AUXILIARY POWER UNIT AIRLINE MAINTENANCE SYSTEM

(71) Applicant: Honeywell International Inc., Morris Plains, NJ (US)

(72) Inventors: Qixiang Li, Morris Plains, NJ (US); Timothy Griffith, Morris Plains, NJ (US); Sapan N Shah, Morris Plains, NJ (US)

(73) Assignee: Honeywell International Inc., Charlotte, NC (US)

( * ) Notice: Subject to any disclaimer, the term of this patent is extended or adjusted under 35 U.S.C. 154(b) by 209 days.

(21) Appl. No.: 16/569,967

(22) Filed: Sep. 13, 2019

(65) Prior Publication Data

US 2021/0078723 A1    Mar. 18, 2021

(51) Int. Cl.
*B64D 45/00*     (2006.01)
*B64F 5/60*      (2017.01)
*G01R 31/00*     (2006.01)
*G07C 5/00*      (2006.01)

(52) U.S. Cl.
CPC ............... *B64D 45/00* (2013.01); *B64F 5/60* (2017.01); *G01R 31/008* (2013.01); *G07C 5/008* (2013.01); *B64D 2045/0085* (2013.01)

(58) Field of Classification Search
CPC ............ B64D 45/00; B64D 2045/0085; B64D 33/00; B64F 5/60; B64F 5/00; B64F 3/00; G01R 31/008; G01R 31/00; G07C 5/008; G07C 5/00
See application file for complete search history.

(56) References Cited

U.S. PATENT DOCUMENTS

| 6,122,575 A | 9/2000 | Schmidt et al. |
| 7,308,614 B2 | 12/2007 | Hassan |
| 10,380,809 B2 * | 8/2019 | Pereira .................. G07C 5/0808 |

(Continued)

FOREIGN PATENT DOCUMENTS

| EP | 3229187 A1 | 10/2017 |
| EP | 3321864 A1 | 5/2018 |
| EP | 3489912 A1 | 5/2019 |

OTHER PUBLICATIONS

Letourneau et al. "Improving preciseness of time to failure predictions: Application to APU starter" IEEE Xplore Digital Library, 2008 International Conference on Prognostics and Health Management.

(Continued)

*Primary Examiner* — James J Lee
*Assistant Examiner* — Steven Vu Nguyen
(74) *Attorney, Agent, or Firm* — Bookoff McAndrews, PLLC

(57) ABSTRACT

Disclosed are systems, methods, and non-transitory computer-readable medium for generating maintenance recommendation for an auxiliary power unit (APU). One system may include collecting APU data, applying an algorithm that may analyze the APU data using one or more tuning parameters to capture elements of the APU data that indicate an APU health concern, and transmitting the captured elements indicating the APU health concern to a cloud-based health monitoring system.

17 Claims, 4 Drawing Sheets

(56) References Cited

U.S. PATENT DOCUMENTS

| | | | |
|---|---|---|---|
| 2013/0176133 A1* | 7/2013 | Phelps | G05B 23/0272 |
| | | | 340/679 |
| 2016/0244179 A1 | 8/2016 | Catt | |
| 2017/0039785 A1* | 2/2017 | Richter | G07C 5/0808 |
| 2017/0291715 A1 | 10/2017 | Jayathirtha et al. | |
| 2018/0229856 A1 | 8/2018 | Agrawal | |
| 2019/0019354 A1* | 1/2019 | Jordan | G08G 5/0013 |
| 2019/0092495 A1 | 3/2019 | Lu et al. | |
| 2020/0204464 A1* | 6/2020 | Watson | B64F 5/60 |
| 2021/0004461 A1* | 1/2021 | Guilley | G01R 31/31719 |

OTHER PUBLICATIONS

Edwards et al. "Internet of Things—A Complete Solution for Aviations's Predictive Maintenance" Springer for Research & Development, Oct. 22, 2016.

Chen et al. "APU feature integration based on multi-variant flight data analysis" IEEE Xplore Digital Library, 2016 IEEE International Conference on Prognostics and Health Management (ICPHM).

\* cited by examiner

INTERNET CONNECTED AUXILIARY POWER UNIT AIRLINE MAINTENANCE SYSTEM

TECHNICAL FIELD

Various embodiments of the present disclosure generally relate to an internet connected service for aircraft maintenance troubleshooting, and more particularly, to utilize real-time data to support maintenance practices of aircraft auxiliary power units (APU).

BACKGROUND

Large aircraft often use an on-board auxiliary power unit (APU) to provide electrical power and compressed air for systems throughout the airplane. When the aircraft is grounded, the APU provides the main source of power for environmental control systems, hydraulic pumps, electrical systems, and main engine starters. During flight, the APU can supply pneumatic and electric power. Other APU functions may include charging the batteries. The APU Electronic Control Unit (ECU) provides a fully automatic control system that controls and protects the APU during all modes of operation. The ECU also monitors engine operation using signals from several sensors mounted on the engine. The ECU provides two health monitoring data sources, e.g. dump data bus and Built-In Test Equipment (BITE) data bus. These two data sources provide significant information on the health of the APU.

The background description provided herein is for the purpose of generally presenting the context of the disclosure. Unless otherwise indicated herein, the materials described in this section are not prior art to the claims in this application and are not admitted to be prior art, or suggestions of the prior art, by inclusion in this section.

SUMMARY OF DISCLOSURE

According to certain aspects of the disclosure, systems and methods are disclosed to administer APU maintenance support through an internet connected service to provide generated maintenance recommendations to aircraft support services.

In one embodiment, a computer-implemented method is disclosed for generating maintenance recommendation for an auxiliary power unit (APU). The computer-implemented method may comprise: collecting, by one or more processors, raw data of an APU; processing, by the one or more processors, the raw data into digitized APU data; transmitting, by the one or more processors, the digitized APU data to an edge node; transmitting, by the one or more processors, one or more tuning parameters from a cloud-based health monitoring system, the one or more tuning parameters including a threshold level that is adjustable by the cloud-based health monitoring system based on the digitized APU data; applying, by the one or more processors at the edge node, an algorithm that analyzes the digitized APU data using the one or more tuning parameters to capture elements of the digitized APU data that indicate an APU health concern; and transmitting, by the one or more processors, the captured elements indicating the APU health concern to the cloud-based health monitoring system.

In accordance with another embodiment, a computer-implemented system is disclosed for generating maintenance recommendation for an auxiliary power unit (APU). The computer-implemented system may comprise: a memory having processor-readable instructions stored therein; and at least one processor configured to access the memory and execute the processor-readable instructions, which when executed by the processor configures the processor to perform functions for: collecting raw data of an APU; processing the raw data into digitized APU data; transmitting the digitized APU data to an edge node; transmitting one or more tuning parameters from a cloud-based health monitoring system, the one or more tuning parameters including a threshold level that is adjustable by the cloud-based health monitoring system based on the digitized APU data; applying, at the edge node, an algorithm that analyzes the digitized APU data using the one or more tuning parameters to capture elements of the digitized APU data that indicate an APU health concern; and transmitting the captured elements indicating the APU health concern to the cloud-based health monitoring system.

In accordance with another embodiment, a non-transitory computer-readable medium is disclosed for generating maintenance recommendation for an auxiliary power unit (APU). The non-transitory computer-readable medium storing instruction that, when executed by at least one processor, may configure the at least one processor to perform: collecting, by one or more processors, raw data of an APU; processing, by the one or more processors, the raw data into digitized APU data; transmitting, by the one or more processors, the digitized APU data to an edge node; transmitting, by the one or more processors, one or more tuning parameters from a cloud-based health monitoring system, the one or more tuning parameters including a threshold level that is adjustable by the cloud-based health monitoring system based on the digitized APU data; applying, by the one or more processors at the edge node, an algorithm that analyzes the digitized APU data using the one or more tuning parameters to capture elements of the digitized APU data that indicate an APU health concern; and transmitting, by the one or more processors, the captured elements indicating the APU health concern to the cloud-based health monitoring system.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
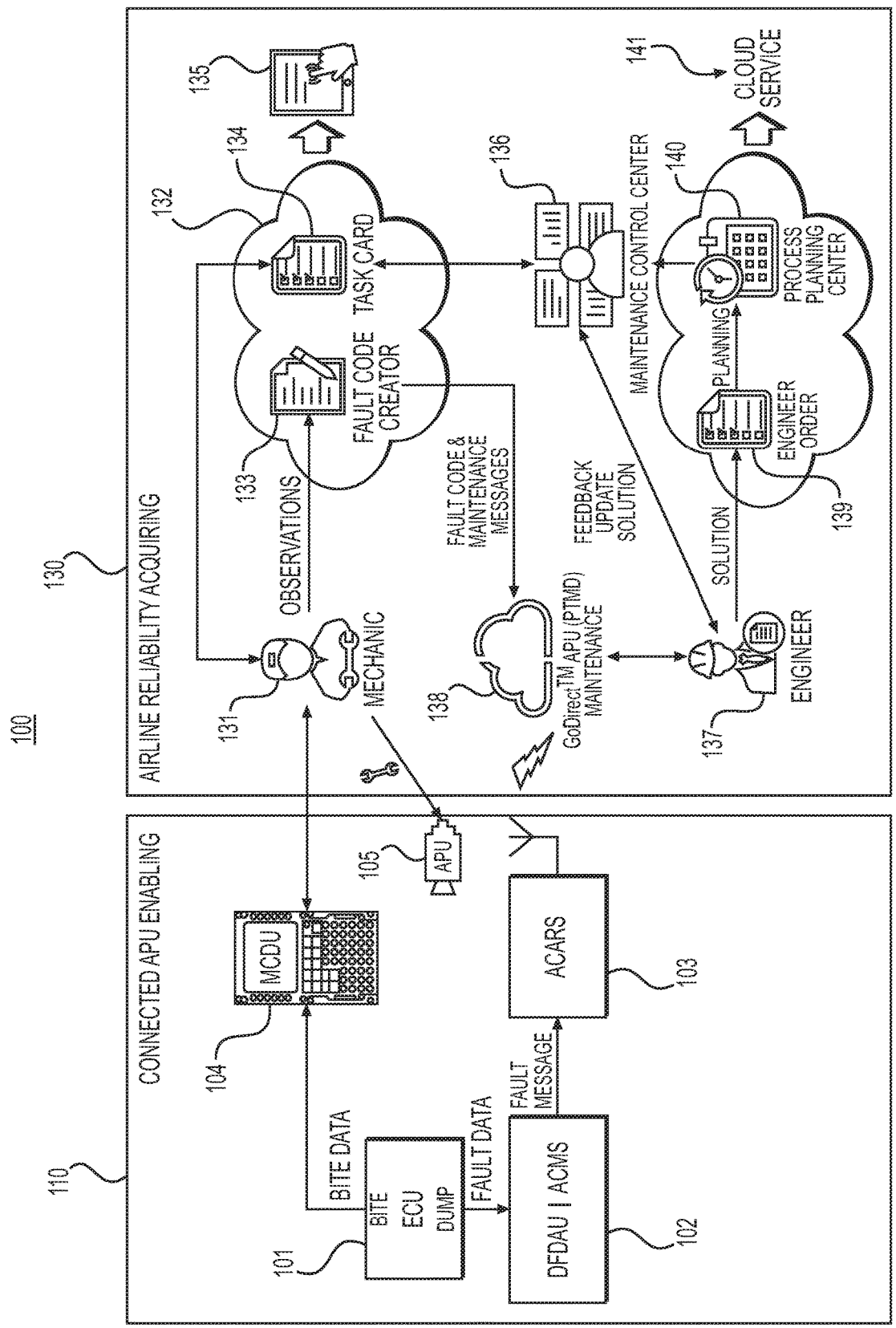
FIG. 1 depicts an overview of an exemplary system for an aircraft auxiliary power unit health monitoring system.

Typically APU health data and messages have been physically downloaded from a Quick Access Recorder (QAR) to a Personal Computer Memory Card International Association (PCMCIA) card. Analysis of the downloaded data from the QAR by trained experts may determine the health of the APU. A maintenance technician or engineer must access the airplane to perform the download to a data storage device. The retrieval of APU health data takes time and resources to obtain so airlines will typically schedule this activity for when it is convenient. Another method to check APU health is to do a BITE test in the cockpit after each flight. A BITE test requires engineering, planning and line maintenance resources and may be complicated to conduct, therefore disrupting aircraft service schedules. Therefore, a need exists for a solution to address the timeline of in-the-field maintenance action related to the APU to avoid any operation disruption.

In the present disclosure, edge computing may be used to timely process aircraft data which allows airlines to resolve APU maintenance actions in time to prevent flight delays and cancellations. To accomplish the desired results, edge nodes may be employed on aircrafts to process the data from either a dump data bus or BITE data bus in real time. Preliminary computing may be performed by the edge node to identify any APU core or line-replaceable unit (LRU) health alerts. A summary report identifying the APU systems of concern may be transmitted directly from the edge node or through the data communication system of the aircraft, for example the Aircraft Communications Addressing and Reporting System (ACARS).

The present disclosure also includes an architecture and process in which tasks may be performed on a component based on evidence of need, which integrates reliability, reliability-centered maintenance (RCM), and Condition Based Maintenance (CBM) analysis. These processes, technologies, and capabilities may enhance the readiness and maintenance effectiveness of an aircraft system and APU. The disclosed systems and methods may use a system engineering approach to collect data, enable analysis, and support the decision-making processes. Analysis, diagnostics, and predictions may include, but are not limited to, predicting remaining useful life (RUL), making troubleshooting decisions, and determining failure points.

The subject matter of the present description will now be described more fully hereinafter with reference to the accompanying drawings, which form a part thereof, and which show, by way of illustration, specific exemplary embodiments. An embodiment or implementation described herein as "exemplary" is not to be construed as preferred or advantageous, for example, over other embodiments or implementations; rather, it is intended to reflect or indicate that the embodiment(s) is/are "example" embodiment(s). Subject matter can be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of exemplary embodiments in whole or in part.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. Both the foregoing general description and the following detailed description are exemplary and explanatory only and are not restrictive of the features, as claimed.

In this disclosure, the term "based on" means "based at least in part on." The singular forms "a," "an," and "the" include plural referents unless the context dictates otherwise. The term "exemplary" is used in the sense of "example" rather than "ideal." The term "or" is meant to be inclusive and means either, any, several, or all of the listed items. The terms "comprises," "comprising," "includes," "including," or other variations thereof, are intended to cover a non-exclusive inclusion such that a process, method, or product that comprises a list of elements does not necessarily include only those elements, but may include other elements not expressly listed or inherent to such a process, method, article, or apparatus. Relative terms, such as, "substantially" and "generally," are used to indicate a possible variation of ±10% of a stated or understood value.

Referring now to the appended drawings, FIG. 1 depicts the system 100 of the edge computing based aircraft auxiliary power unit health monitoring system.

As shown in system 100, two distinct sections 110 and 130 may combine to establish system 100. Section 110 may be made up of internet connected APU enabling devices and section 130 may be made up of airline reliability processing or acquiring systems.

The internet connected APU enabling devices 110 may include the Electronic Control Unit (ECU) 101, a Digital Flight Data Acquisition unit (DFDAU) with an integrated Airplane Condition Monitoring System (ACMS) 102, an Aircraft Communications Addressing and Reporting System (ACARS) 103, a Multi-Function Control and Display Unit (MCDU) 104, and an APU 105. The DFDAU/ACMS 102 may be an edge node employed on an aircraft, the ACARS 103 may be the communications interface between the aircraft and ground systems, and the MCDU 104 may provide the interface to the ECU enabling ground crews such as mechanics to read BITE messages. The ECU may collect data from the APU 105, then the ECU may transmit the raw APU data to the DFDAU/ACMS 102 for processing. The DFDAU may then digitize the raw APU data and ACMS may analyze the digitized data for any exceedance. If the ACMS detects any exceedance, ACMS may send a transmit command to ACARS 103 which may then transmit the exceedance report to the ground systems.

The airline reliability processing system 130 may allow in-the-field mechanics to create fault reports in a digital environment and also may help to create an optimized schedule for the maintenance activities. The airline reliability processing system 130 may include ground crew 131, such as mechanics, APU maintenance tool application 132, fault code creator 133, task card 134, user device 135, maintenance control center (MCC) 136, support crew 137, such as engineers, analytics engine host 138, engineer order 139, process planning center (PPC) 140, and cloud services 141. The user device 135 may be any one of a mobile computer, laptop, tablet, mobile phone, personal digital assistant (PDA), or any other device that is capable of executing mobile applications.

During the operation of system 100, when a ground crew 131 (e.g. mechanic) observes a defect from the aircraft, the mechanic may utilize a mobile application fault code creator 133 that may help with specifying a common fault phenomenon identification from the multitude of potential human descriptions of the faults or observation. This application provides a short-cut for the system to avoid data cleansing process which may be the most difficult task in the data analytics methodology. The fault code creator 133 mobile application may reside in a user device 135 and the ground crew 131 may manually feed their observation report by interacting with the MCDU 104 and the fault code creator 133.

After receiving observations from ground crew 131, the fault code creator 133 may transmit the fault codes and maintenance messages with the common unified identification to an analytics engine host 138. The analytics engine host 138 may incorporate a predictive trend monitoring and diagnostics (PTMD) application that may be used to generate a maintenance recommendation. After the maintenance recommendations are generated, the recommendations may be presented to the airline support crew 137 (e.g., engineers) and, based on the maintenance recommendations, the support crew 137 may refer to a fault isolation manual to diagnose potential faults. After diagnoses of faults by the support crew 137, fault solutions may be established by the support crew 137 and may be converted into an engineering order 139. The planning application located at the PPC 140 may receive the engineering order 139 and performs evaluations on the order. The engineering order 139 may be evaluated based on at least two factors, for example, the PPC 140 may evaluate the engineering order 139 to determine if the engineering order 139 is necessary based on the maintenance steering group (MSG-3) protocol and may also determine the optimum time to schedule the engineering order 139 into maintenance process based on the remaining useful life (RUL) of the APU, spare part or maintenance service availability, or aircraft operational schedules. The engineering order 139 and the evaluation determination may also be transmitted to the cloud service 141 which may collect the dispatch reliability data to support the planning application and to evaluate the optimized maintenance plan.

If it is determined that the engineering order 139 meets criteria for implementation the engineering order 139 may be transmitted to the maintenance control center (MCC) 136. Criteria for implementation may include severity of the issue, availability of replacement parts of personnel and desire for further diagnoses. At the MCC 136 the engineering order 139 may be converted into task card 134 which may allow the ground crew 131 to sign off step by step when performing maintenance actions and thereby ensuring all procedures are followed. The task card 134 may be integrated with the fault code creator 133 into the APU maintenance tool application 132 and may be operated by the ground crew 131 via user device 135. The task card 134 may allow the ground crew 131 to check and sign off the task items and provide feedback to the support crew 137 through the fault code creator 133 until the fault is fixed.

As indicated above, FIG. 1 is provided merely as an example. Other examples are possible and may differ from what was described with regard to FIG. 1. The number and arrangement of devices and networks shown in FIG. 1 are provided as an example. In practice, there may be additional devices, fewer devices and/or networks, different devices and/or networks, or differently arranged devices and/or networks than those shown in FIG. 1. Furthermore, two or more devices shown in FIG. 1 (e.g., fault code creator 133 and task card 134) may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
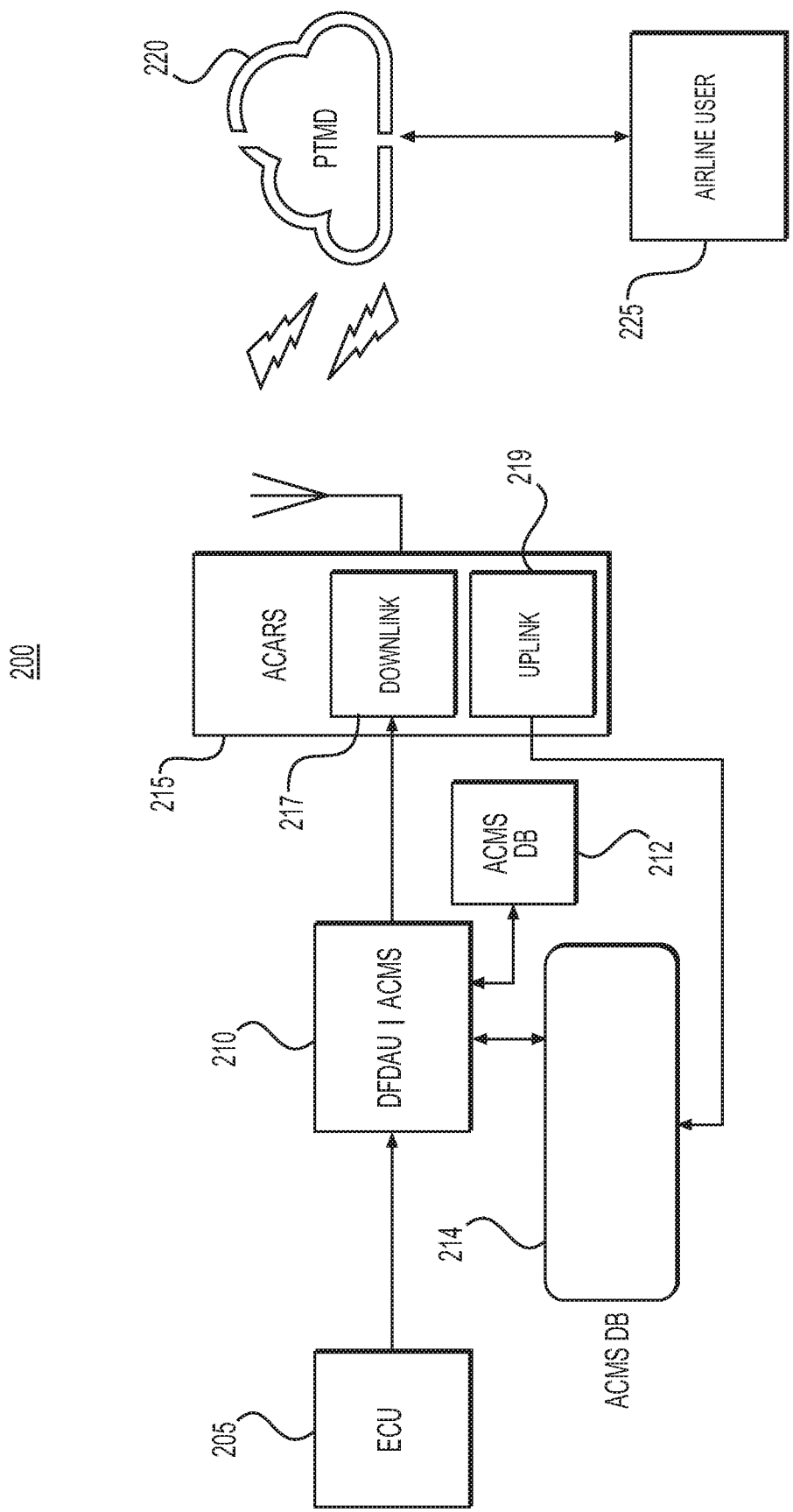
FIG. 2 depicts a detailed architecture of an edge computing based aircraft auxiliary power unit health monitoring system, according to one aspect of the present disclosure.

FIG. 2 depicts a detailed architecture of an edge computing based aircraft auxiliary power unit health monitoring system 200, according to one aspect of the present disclosure.

System 200 may include an ECU 205, DFDAU/ACMS 210, ACMS database 212, ACMS database 214, ACARS 215 which includes downlink component 217 and uplink component 219, analytics engine host 220, and airline user 225. Elements depicted in system 200 may correspond to elements shown in FIG. 1. For example, analytics engine host 220 may correspond to analytics engine host 138 and may incorporate a predictive trend monitoring and diagnostics (PTMD) application that may be used to generate a maintenance recommendation. Airline user 225 may correspond to ground crew 131 and support crew 137. Downlink component 217 and uplink component 219 may be any type of transmission components and may be capable of wired or wireless transmission of data.

In one embodiment of the current disclosure, the Airplane Condition Monitoring System of Digital Flight Data Acquisition Unit (DFDAU/ACMS 210) may be used as the edge node for computing to identify the health of an APU. In another embodiment, the edge computing node may be a dedicated unit which is installed on the airplane. The edge node may be responsible for processing raw APU data, identifying APU health issues, and transmitting the information to an ACMS system or directly to a cloud based health monitoring system. Software embodying the logic and algorithms to calculate APU health monitoring may be embedded in the ACMS. The software may be created under ACMS software coding specifications. The APU health monitoring performed at an edge node of the ACMS may be stored into ACMS database 214 and the ACMS database 212 may function as a trigger for exceedance reports determined by the ACMS.

The APU health monitoring algorithms may only capture elements that indicate a potential APU concern while minimizing the capture and conveyance of nuisance faults or messages. The APU health monitoring algorithms may then analyze the capture data to validate APU faults. The APU health monitoring algorithms may incorporate a sliding window and vector support machine based algorithm, or it may incorporate other algorithms known in the art for validating APU fault detection. The APU health monitoring algorithms may apply in real-time a sliding window to identify a subset of the raw APU data to analyze, and then may apply a likelihood function to the APU data in the sliding window to identify potential APU health concerns, and may store the APU data indicating a potential health concern in a buffer. The APU health monitoring algorithms may then further apply a clustering technique to the APU data in the buffer that may distinguish true APU health concerns from intermittent or false-positive APU health concerns, wherein the clustering technique may comprise the use of a support vector machine to cluster APU data indicating true APU health concerns from APU data indicating intermittent or false-positive APU health concerns. A stop timer may be used to end the application of the clustering technique after a pre-determined time period has elapsed. The algorithms may identify APU data with the highest likelihood of indicating a true APU health concern if the clustering has not separated a true APU health concern from intermittent or false-positive APU health concerns. The captured elements indicating an APU health concern may then be transmitted to the analytics engine host 220 to generate a maintenance recommendation.

One of the potential benefits of the APU health monitoring algorithm may be that reduction of time needed to capture and evaluate APU data and the reduction of file sizes and thereby reducing downlink transmission costs. An example of benefits of the APU health monitoring algorithm is depicted in Table 1.

TABLE 1

Difference in time needed and downlink transmission file size between different APU health monitoring methods, where N = number of days.

| Method | Amount of Data Needed | | | Time Effect |
|---|---|---|---|---|
| | Exceedance | Long Term Degradation | No Fault | |
| QAR | 256M* | N × 256M* | 256M* | Post Flight + N day(s) |
| ACMS | 10K | not applicable | 0 | Post Flight |
| APU health monitoring algorithm | 10K | 10K | 0 | Real-Time |

Furthermore, the edge node housed in the DFDAU/ACMS 210 may receive tuning command from the cloud service PTMD 220 to fine tune the algorithm criteria in a real-time basis based on either statistical analysis or any machine learning result done by the PTMD 220 to increase the accuracy of the algorithms. The value of this tuning parameter may be updated by the analytic result from the PTMD 220 through ACARS 215 via uplink 219.

The number and arrangement of modules, devices, and networks shown in FIG. 2 are provided as an example. In practice, there may be additional modules and devices, fewer modules, devices and/or networks, different modules, devices and/or networks, or differently arranged modules, devices and/or networks than those shown in FIG. 2. Furthermore, two or more devices included in environment 200 of FIG. 2 may be implemented within a single device, or a single device in the environment 200 of FIG. 2 may be implemented as multiple, distributed devices. Additionally, or alternatively, a set of devices (e.g., one or more devices) of environment 200 may perform one or more functions described as being performed by another set of devices of environment 200.

Figure 3:
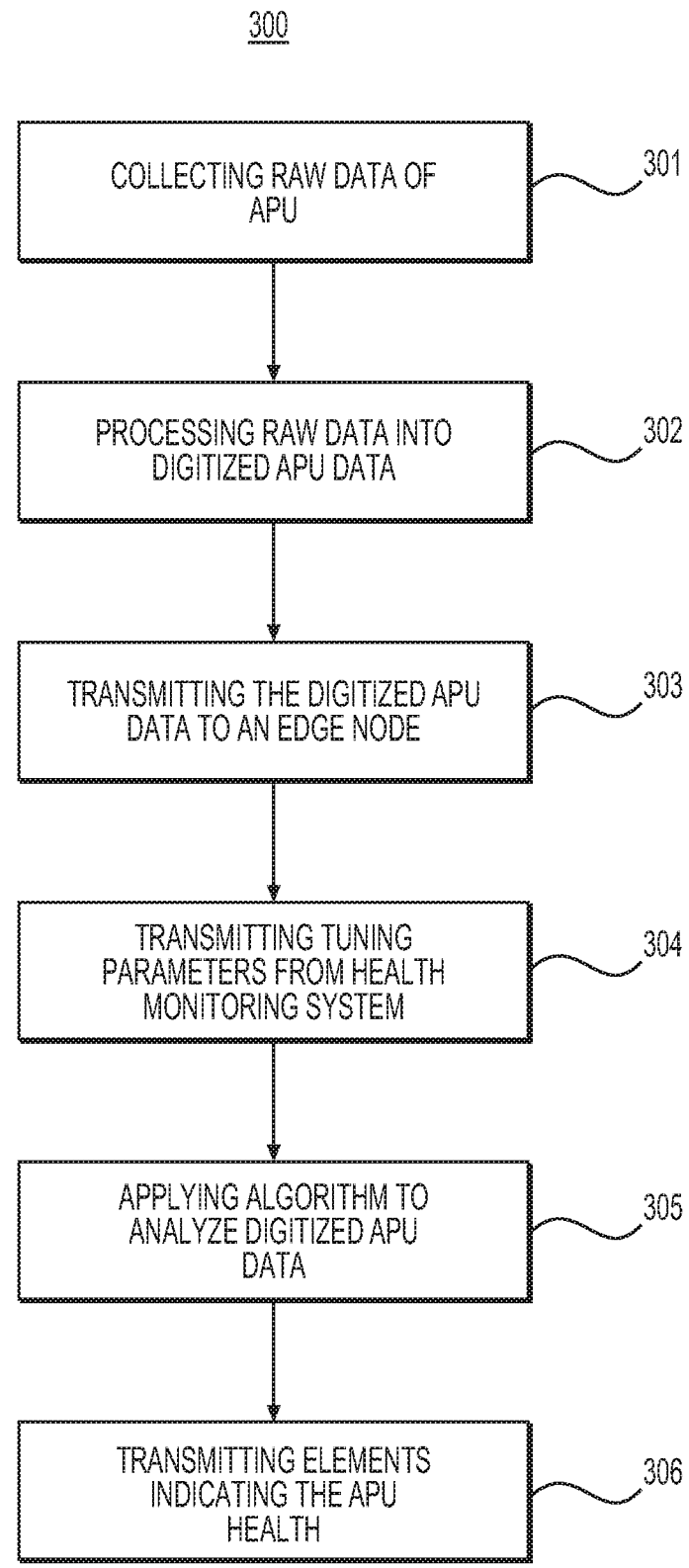
FIG. 3 depicts a flowchart of an exemplary method of generating maintenance practice recommendations for troubleshooting APU faults, according to one aspect of the present disclosure.

FIG. 3 depicts a flowchart of an exemplary method 300 of generating maintenance practice recommendations for troubleshooting APU faults, according to one aspect of the present disclosure.

Method 300 may begin at step 301 where raw data of the APU may be collected to begin APU health monitoring validation. At step 302 the collected raw APU data may be processed and converted into digitized APU data. Then at step 303 the digitized APU data may be transmitted to an edge node of an aircraft. At step 304 tuning parameters may be transmitted from a health monitoring system. The tuning parameters may be used to fine tune the algorithm used for health determination. At step 305 the APU health monitoring algorithms may be applied to the digitized APU data to analyze for APU health indicators. At step 306, health indicators that represent the health of the APU may be transmitted to aircraft operators.

Although FIG. 3 shows example blocks, in some implementations, process 300 may include additional blocks, fewer blocks, different blocks, or differently arranged blocks than those depicted in FIG. 3. Additionally, or alternatively, two or more of the blocks of process 300 may be performed in parallel.

Figure 4:
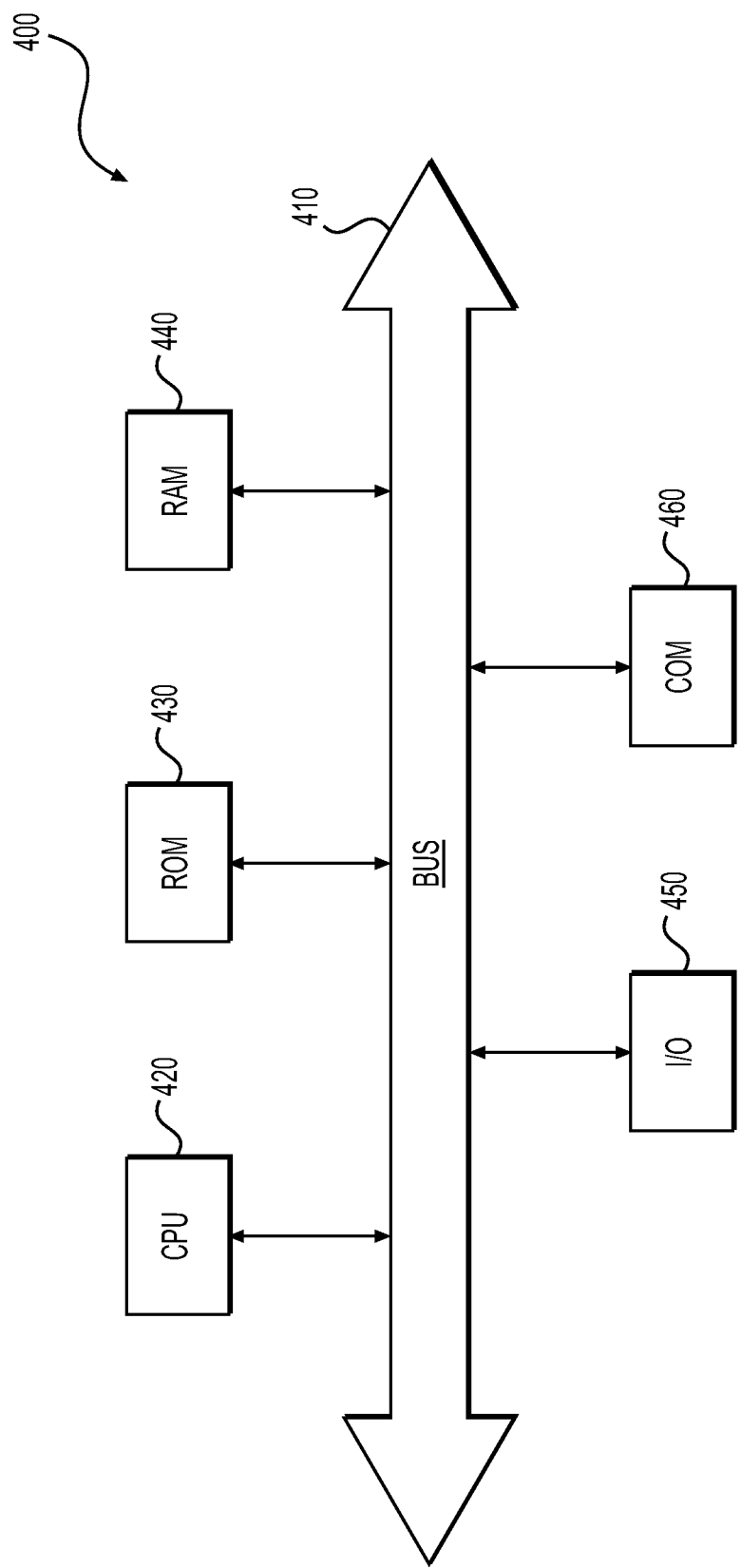
FIG. 4 depicts an exemplary computer device or system, in which embodiments of the present disclosure, or portions thereof, may be implemented.

FIG. 4 depicts a high-level functional block diagram of an exemplary computer device or system, in which embodiments of the present disclosure, or portions thereof, may be implemented, e.g., as computer-readable code. In some implementations, the MCDU 104 or user device 135 (depicted in FIG. 1) may correspond to device 400. Additionally, or alternatively, the ECU 205, the DFDAU/ACMS 210 may each correspond to device 400. Additionally, each of the exemplary computer servers, databases, user interfaces, modules, and methods described above with respect to FIGS. 1-3 can be implemented in device 400 using hardware, software, firmware, tangible computer readable media having instructions stored thereon, or a combination thereof and may be implemented in one or more computer systems or other processing systems. Hardware, software, or any combination of such may implement each of the exemplary systems, user interfaces, and methods described above with respect to FIGS. 1-3.

If programmable logic is used, such logic may be executed on a commercially available processing platform or a special purpose device. One of ordinary skill in the art may appreciate that embodiments of the disclosed subject matter can be practiced with various computer system configurations, including multi-core multiprocessor systems, minicomputers, mainframe computers, computers linked or clustered with distributed functions, as well as pervasive or miniature computers that may be embedded into virtually any device.

For instance, at least one processor device and a memory may be used to implement the above-described embodiments. A processor device may be a single processor or a plurality of processors, or combinations thereof. Processor devices may have one or more processor "cores."

Various embodiments of the present disclosure, as described above in the examples of FIGS. 1-3, may be implemented using device 400. After reading this description, it will become apparent to a person skilled in the relevant art how to implement embodiments of the present disclosure using other computer systems and/or computer architectures. Although operations may be described as a sequential process, some of the operations may in fact be performed in parallel, concurrently, and/or in a distributed environment, and with program code stored locally or remotely for access by single or multi-processor machines. In addition, in some embodiments the order of operations may be rearranged without departing from the spirit of the disclosed subject matter.

As shown in FIG. 4, device 400 may include a central processing unit (CPU) 420. CPU 420 may be any type of processor device including, for example, any type of microprocessor device. As will be appreciated by persons skilled in the relevant art, CPU 420 also may be a single processor in a multi-core/multiprocessor system, such system operating alone, or in a cluster of computing devices operating in a cluster or server farm. CPU 420 may be connected to a data communication infrastructure 410, for example, a bus, message queue, network, or multi-core message-passing scheme.

Device 400 also may include a main memory 440, for example, random access memory (RAM), and also may include a secondary memory 430. Secondary memory 430, e.g., a read-only memory (ROM), may be, for example, a hard disk drive or a removable storage drive. Such a removable storage drive may comprise, for example, a floppy disk drive, a magnetic tape drive, an optical disk drive, a flash memory, or the like. The removable storage drive in this example reads from and/or writes to a removable storage unit in a well-known manner. The removable storage unit may comprise a floppy disk, magnetic tape, optical disk, etc., which is read by and written to by the removable storage drive. As will be appreciated by persons skilled in the relevant art, such a removable storage unit generally includes a computer usable storage medium having stored therein computer software and/or data.

In alternative implementations, secondary memory 430 may include other similar means for allowing computer programs or other instructions to be loaded into device 400. Examples of such means may include a program cartridge and cartridge interface (such as that found in video game devices), a removable memory chip (such as an EPROM, or PROM) and associated socket, and other removable storage units and interfaces, which allow software and data to be transferred from a removable storage unit to device 400.

Device 400 also may include a communications interface ("COM") 460. Communications interface 460 allows software and data to be transferred between device 400 and external devices. Communications interface 460 may include a modem, a network interface (such as an Ethernet card), a communications port, a PCMCIA slot and card, or the like. Software and data transferred via communications interface 460 may be in the form of signals, which may be electronic, electromagnetic, optical, or other signals capable of being received by communications interface 460. These signals may be provided to communications interface 460 via a communications path of device 400, which may be implemented using, for example, wire or cable, fiber optics, a phone line, a cellular phone link, an RF link or other communications channels.

The hardware elements, operating systems and programming languages of such equipment are conventional in nature, and it is presumed that those skilled in the art are adequately familiar therewith. Device 400 also may include input and output ports 450 to connect with input and output devices such as keyboards, mice, touchscreens, monitors, displays, etc. Of course, the various server functions may be implemented in a distributed fashion on a number of similar platforms, to distribute the processing load. Alternatively, the servers may be implemented by appropriate programming of one computer hardware platform.

The systems, apparatuses, devices, and methods disclosed herein are described in detail by way of examples and with reference to the figures. The examples discussed herein are examples only and are provided to assist in the explanation of the apparatuses, devices, systems, and methods described herein. None of the features or components shown in the drawings or discussed below should be taken as mandatory for any specific implementation of any of these the apparatuses, devices, systems, or methods unless specifically designated as mandatory. For ease of reading and clarity, certain components, modules, or methods may be described solely in connection with a specific figure. In this disclosure, any identification of specific techniques, arrangements, etc. are either related to a specific example presented or are merely a general description of such a technique, arrangement, etc. Identifications of specific details or examples are not intended to be, and should not be, construed as mandatory or limiting unless specifically designated as such. Any failure to specifically describe a combination or sub-combination of components should not be understood as an indication that any combination or sub-combination is not possible. It will be appreciated that modifications to disclosed and described examples, arrangements, configurations, components, elements, apparatuses, devices, systems, methods, etc. can be made and may be desired for a specific application. Also, for any methods described, regardless of whether the method is described in conjunction with a flow diagram, it should be understood that unless otherwise specified or required by context, any explicit or implicit ordering of steps performed in the execution of a method does not imply that those steps must be performed in the order presented but instead may be performed in a different order or in parallel.

Throughout this disclosure, references to components or modules generally refer to items that logically can be grouped together to perform a function or group of related functions. Like reference numerals are generally intended to refer to the same or similar components. Components and modules can be implemented in software, hardware, or a combination of software and hardware. The term "software" is used expansively to include not only executable code, for example machine-executable or machine-interpretable instructions, but also data structures, data stores and computing instructions stored in any suitable electronic format, including firmware, and embedded software. The terms "information" and "data" are used expansively and includes a wide variety of electronic information, including executable code; content such as text, video data, and audio data, among others; and various codes or flags. The terms "information," "data," and "content" are sometimes used interchangeably when permitted by context.

It is intended that the specification and examples be considered as exemplary only, with a true scope and spirit of the disclosure being indicated by the following claims.

What is claimed is:

1. A computer-implemented method for generating maintenance recommendation for an auxiliary power unit (APU), the method comprising:

transmitting, by one or more processors, digitized APU data to an edge node;

transmitting, by the one or more processors, one or more tuning parameters from a computer-implemented cloud-based health monitoring system to the edge node, the one or more tuning parameters including a threshold level that is adjustable by the computer-implemented cloud-based health monitoring system based on the digitized APU data;

applying, by the one or more processors at the edge node, an algorithm that analyzes the digitized APU data using the one or more tuning parameters to capture only elements of the digitized APU data that indicate an APU health concern, wherein the algorithm is configured to remove digitized APU data indicating intermittent or false-positive APU health concerns, resulting in reduced time to capture and evaluate APU data;

storing, by the one or more processors, the digitized APU data that indicate the APU health concern in a buffer;

applying, by the one or more processors, a clustering technique including a support vector machine to the APU data in the buffer to distinguish a true APU health concern from intermittent or false-positive APU health concerns, wherein a stop timer is used to end the application of the clustering technique after a pre-determined time period has elapsed; and transmitting, by the one or more processors, the captured elements indicating the true APU health concern to the computer-implemented cloud-based health monitoring system.

2. The computer-implemented method of claim 1, further comprising:

providing, by the one or more processors, a plurality of descriptions of an APU fault;

receiving, by the one or more processors, a selection of a common fault phenomenon identification from the plurality of descriptions of an APU fault;

generating, by the one or more processors, an APU fault report from the digitized APU data and the common fault phenomenon identification from the plurality of descriptions of an APU fault; and transmitting, by the one or more processors, the APU fault report to the computer-implemented cloud-based health monitoring system to generate a maintenance recommendation.

3. The computer-implemented method of claim 2, wherein the computer-implemented cloud-based health monitoring system is configured to analyze the digitized APU data and information from the APU fault report to update the one or more tuning parameters and to generate a maintenance recommendation.

4. The computer-implemented method of claim 3, further include:

generating, by the one or more processors, a digitized task card that identifies maintenance actions to be performed based on the maintenance recommendation from the computer-implemented cloud-based health monitoring system.

5. The computer-implemented method of claim 1, further comprising:

applying, by the one or more processors to the algorithm, a sliding window algorithm to identify a subset of the digitized APU data to analyze;

applying, by the one or more processors, a likelihood function to the digitized APU data in the sliding window to identify data indicating potential APU health concerns; and storing, by the one or more processors, the data indicating potential APU health concerns in the buffer.

6. The computer-implemented method of claim 1, wherein the edge node is one of a discrete unit on an aircraft or integrated with airplane condition monitoring system (ACMS).

7. A computer-implemented system for generating maintenance recommendation for an auxiliary power unit (APU), the computer-implemented system comprising:

a memory having processor-readable instructions stored therein; and at least one processor configured to access the memory and execute the processor-readable instructions, which when executed by the processor configures the processor to perform functions for:

transmitting digitized APU data to an edge node;

transmitting one or more tuning parameters from a computer-implemented cloud-based health monitoring system to the edge node, the one or more tuning parameters including a threshold level that is adjustable by the computer-implemented cloud-based health monitoring system based on the digitized APU data;

applying, at the edge node, an algorithm that analyzes the digitized APU data using the one or more tuning parameters to capture only elements of the digitized APU data that indicate an APU health concern, wherein the algorithm is configured to remove digitized APU data indicating intermittent or false-positive APU health concerns, resulting in reduced time to capture and evaluate APU data;

storing the digitized APU data that indicate the APU health concern in a buffer;

applying a clustering technique including a support vector machine to the APU data in the buffer to distinguish a true APU health concern from intermittent or false-positive APU health concerns, wherein a stop timer is used to end the application of the clustering technique after a pre-determined time period has elapsed; and transmitting the captured elements indicating the true APU health concern to the computer-implemented cloud-based health monitoring system.

8. The computer-implemented system of claim 7, further comprising:

providing a plurality of descriptions of an APU fault;

receiving a selection of a common fault phenomenon identification from the plurality of descriptions of an APU fault;

generating an APU fault report from the digitized APU data and the common fault phenomenon identification from the plurality of descriptions of an APU fault; and transmitting the APU fault report to the computer-implemented cloud-based health monitoring system to generate a maintenance recommendation.

9. The computer-implemented system of claim 8, wherein the computer-implemented cloud-based health monitoring system is configured to analyze the digitized APU data and information from the APU fault report to update the one or more tuning parameters and to generate a maintenance recommendation.

10. The computer-implemented system of claim 9, further include:

generating a digitized task card that identifies maintenance actions to be performed based on the maintenance recommendation from the computer-implemented cloud-based health monitoring system.

11. The computer-implemented system of claim 7, further comprising:

applying a sliding window algorithm to identify a subset of the digitized APU data to analyze;

applying a likelihood function to the digitized APU data in the sliding window to identify data indicating potential APU health concerns; and storing the data indicating potential APU health concerns in the buffer.

12. The computer-implemented system of claim 7, wherein the edge node is one of a discrete unit on an aircraft or integrated with airplane condition monitoring system (ACMS).

13. A non-transitory computer-readable medium containing instructions for generating maintenance recommendation for an auxiliary power unit (APU), the non-transitory computer-readable medium storing instruction that, when executed by at least one processor, configure the at least one processor to perform:

transmitting, by one or more processors, digitized APU data to an edge node;

transmitting, by the one or more processors, one or more tuning parameters from a computer-implemented cloud-based health monitoring system to the edge node, the one or more tuning parameters including a threshold level that is adjustable by the computer-implemented cloud-based health monitoring system based on the digitized APU data;

applying, by the one or more processors at the edge node, an algorithm that analyzes the digitized APU data using the one or more tuning parameters to capture only elements of the digitized APU data that indicate an APU health concern, wherein the algorithm is configured to remove digitized APU data indicating intermittent or false-positive APU health concerns, resulting in reduced time to capture and evaluate APU data;

storing, by the one or more processors, the digitized APU data that indicate the APU health concern in a buffer;

applying, by the one or more processors, a clustering technique including a support vector machine to the APU data in the buffer to distinguish a true APU health concern from intermittent or false-positive APU health concerns, wherein a stop timer is used to end the application of the clustering technique after a predetermined time period has elapsed; and transmitting, by the one or more processors, the captured elements indicating the true APU health concern to the computer-implemented cloud-based health monitoring system.

14. The non-transitory computer-readable medium of claim 13, further comprising:

providing, by the one or more processors, a plurality of descriptions of an APU fault;

receiving, by the one or more processors, a selection of a common fault phenomenon identification from the plurality of descriptions of an APU fault;

generating, by the one or more processors, an APU fault report from the digitized APU data and the common fault phenomenon identification from the plurality of descriptions of an APU fault; and transmitting, by the one or more processors, the APU fault report to the computer-implemented cloud-based health monitoring system to generate a maintenance recommendation.

15. The non-transitory computer-readable medium of claim 14, wherein the computer-implemented cloud-based health monitoring system is configured to analyze the digitized APU data and information from the APU fault report to update the one or more tuning parameters and to generate a maintenance recommendation.

16. The non-transitory computer-readable medium of claim 15, further include:

generating, by the one or more processors, a digitized task card that identifies maintenance actions to be performed based on the maintenance recommendation from the computer-implemented cloud-based health monitoring system.

17. The non-transitory computer-readable medium of claim 13, further comprising:

applying, by the one or more processors to the algorithm, a sliding window algorithm to identify a subset of the digitized APU data to analyze;

applying, by the one or more processors, a likelihood function to the digitized APU data in the sliding window to identify data indicating potential APU health concerns; and storing, by the one or more processors, the data indicating potential APU health concerns in the buffer.

* * * * *